United States Patent
Tikhonov et al.

(10) Patent No.: US 8,999,009 B2
(45) Date of Patent: Apr. 7, 2015

(54) SURFACE MODIFICATION OF BATTERY MATERIALS AND METHOD FOR MAKING A BATTERY

(71) Applicant: A123 Systems LLC, Waltham, MA (US)

(72) Inventors: Konstantin Tikhonov, Pleasanton, CA (US); Tzu-Yuan Lin, San Jose, CA (US)

(73) Assignee: A123 Systems LLC, Waltham, MA (US)

( * ) Notice: Subject to any disclaimer, the term of this patent is extended or adjusted under 35 U.S.C. 154(b) by 261 days.

(21) Appl. No.: 13/788,950

(22) Filed: Mar. 7, 2013

(65) Prior Publication Data

US 2013/0232772 A1     Sep. 12, 2013

Related U.S. Application Data

(60) Provisional application No. 61/608,033, filed on Mar. 7, 2012.

(51) Int. Cl.
*H01M 4/82* (2006.01)
*H01M 4/04* (2006.01)
*C23C 16/00* (2006.01)

(52) U.S. Cl.
CPC .............. *H01M 4/049* (2013.01); *C23C 16/00* (2013.01)

(58) Field of Classification Search
None
See application file for complete search history.

(56) References Cited

U.S. PATENT DOCUMENTS

| | | | |
|---|---|---|---|
| 5,783,328 A | 7/1998 | Wang | |
| 5,961,671 A | 10/1999 | Guindy et al. | |
| 2002/0012846 A1* | 1/2002 | Skotheim et al. | 429/231.95 |
| 2005/0069484 A1* | 3/2005 | Manev et al. | 423/594.15 |
| 2005/0151115 A1* | 7/2005 | Hampden-Smith et al. | 252/182.1 |
| 2005/0250013 A1* | 11/2005 | Tatsumi et al. | 429/231.95 |
| 2010/0193730 A1* | 8/2010 | Yamamura | 252/182.1 |
| 2010/0247986 A1* | 9/2010 | Toyama et al. | 429/61 |
| 2011/0217574 A1* | 9/2011 | Toyama et al. | 429/61 |

* cited by examiner

*Primary Examiner* — Patrick Ryan
*Assistant Examiner* — Jose Colucci Rios
(74) *Attorney, Agent, or Firm* — Alleman Hall McCoy Russell & Tuttle LLP

(57) ABSTRACT

Provided herein are methods for processing electrochemically active materials for use in rechargeable batteries. The methods may also be practiced on electrodes and batteries containing such electrochemically active materials. In a typical embodiment, a method of chemically modifying the surface of an electrochemically active component of a battery is provided, the method including receiving the electrochemically active material and exposing the electrochemically active material to a gaseous reactant under conditions that chemically modify surfaces of the electrochemically active material that are accessible to the gaseous reactant, and thereby produce a modified electrochemically active material having improved properties for use in the battery.

23 Claims, 6 Drawing Sheets

SURFACE MODIFICATION OF BATTERY MATERIALS AND METHOD FOR MAKING A BATTERY

CROSS-REFERENCE TO RELATED APPLICATION

This application claims the benefit of priority to U.S. Provisional Application No. 61/608,033, titled "SURFACE MODIFICATION OF BATTERY MATERIALS AND METHOD FOR MAKING A BATTERY," filed Mar. 7, 2012, all of which is incorporated herein by this reference.

BACKGROUND

Some catalytic activity of active materials used in positive and negative electrodes of lithium batteries can have deleterious effects. For example, battery degradation is often a result of electrolyte decomposition that takes place at the anode and/or cathode, possibly due to the catalytic activity of the active material surface or a presence of specific functional groups. The decomposition of electrolyte results in increased impedance and gas generation. Both cathode material and anode material can exhibit such deleterious activity.

SUMMARY

Provided herein are methods for processing electrochemically active materials for use in rechargeable batteries. The methods may also be practiced on electrodes and batteries containing such electrochemically active materials.

In one aspect of the disclosed embodiments, a method of chemically modifying the surface of an electrochemically active component of a lithium ion battery is provided, the method including receiving the electrochemically active material for a lithium ion battery, and exposing the electrochemically active material to a gaseous reactant under conditions that chemically modify surfaces of the electrochemically active material that are accessible to the gaseous reactant, and thereby produce a modified electrochemically active material having improved properties for use in the lithium battery.

The electrochemically active material may be part of a partially fabricated lithium battery. As such, in certain implementations, receiving the electrochemically active material includes receiving a partially fabricated lithium battery containing the electrochemically active material. In certain cases the gaseous reactant may have a molecular weight of about 300 g/mol or less. There are many options available for the gaseous reactant. In some cases, the gaseous reactant is selected from the group consisting of hydrides, oxides, sulfides, oxysulfides, fluorides, and oxyfluorides of carbon, sulfur, phosphorus and boron. Additionally, the gaseous reactant may be selected from the group consisting of carbon dioxide ($CO_2$), carbon monoxide (CO), boron trifluoride ($BF_3$), carbon tetrafluoride ($CF_4$), carbonyl fluoride ($COF_2$), carbonyl sulfide (COS), fluoroform, forane, methyl fluoride, hexafluoropropylene, hydrogen sulfide, nitrogen trifluoride, phosphorus pentafluoride, perfluoropropane, sulfur dioxide, sulfur hexafluoride, sulfur tetrafluoride, and combinations thereof. A carrier gas may be used to deliver the gaseous reactant. In some cases, the carrier gas is chosen to affect the reactivity of the gaseous reactant with the electrochemically active material. For example, the composition and amount of carrier gas may be chosen to achieve a gaseous mixture with a particular reactivity towards the electrochemically active material. This mixture's reactivity with the active material is typically much lower than the reactivity of the pure gaseous reactant. The gaseous reactant may also be a mixture of two or more gaseous compounds. In certain cases, two or more of the gaseous compounds in the gaseous reactant are reactive towards the electrochemically active surface. The gaseous compounds in the gaseous reactant may be selected from the group consisting of nitrogen, helium and argon, in some embodiments.

Many types of electrochemically active materials may benefit from the present embodiments. For example, the electrochemically active material may be an anode active material or a cathode active material. The anode active material may be, for example, lithium titanium oxide or silicon or a silicon alloy. In certain embodiments, the anode active material may be a material that intercalates an alkali metal ion. Where the electrochemically active material is a cathode material, it may be $LiMO_2$, $LiMPO_4$, $LiM_2O_4$, a lithium metal silicide, $MS_x$ (metal sulfide), or $M_xO_y$ (metal oxide), where M is metal such as V, Mn, Fe, Co, Ni, Al, Si, or a combination thereof. In some embodiments, the cathode active material is a lithium metal oxide or lithium mixed metal oxide selected from the group consisting of $LiCoO_2$, $LiMnO_2$, $LiNiO_2$, $LiNi_xCO_{1-x}O_2$, $LiNi_xCo_yMn_{(1-x-y)}O_2$, $LiNi_xCo_yAl_{(1-x-y)}O_2$, where $0<x<1$, and $0<y<1$. In other embodiments, the cathode active material may be a lithium metal phosphate or lithium mixed metal phosphate selected from the group consisting of $LiFePO_4$, $LiMnPO_4$, $LiCoPO_4$, $LiFe_xMn_{1-x}PO_4$, $LiNi_xMn_{1-x}O_4$.

These and other embodiments are described further below with reference to the figures.

DETAILED DESCRIPTION

The disclosed embodiments help to overcome the issues noted above by surface modification through the interaction between gaseous reactants with surface species on battery active materials.

Without wishing to be bound by a particular theory, it is believed that metal oxides and mixed metal oxides of nickel, cobalt, aluminum and/or manganese catalyze oxidation of electrolyte. Specifically, swelling of lithium nickel aluminum oxide (NCA) pouch cells is believed to be, at least partially, due to the presence of hydroxide groups on the electrochemically active surface of the pouch cells, causing oxidation of the electrolyte.

Figure 1:
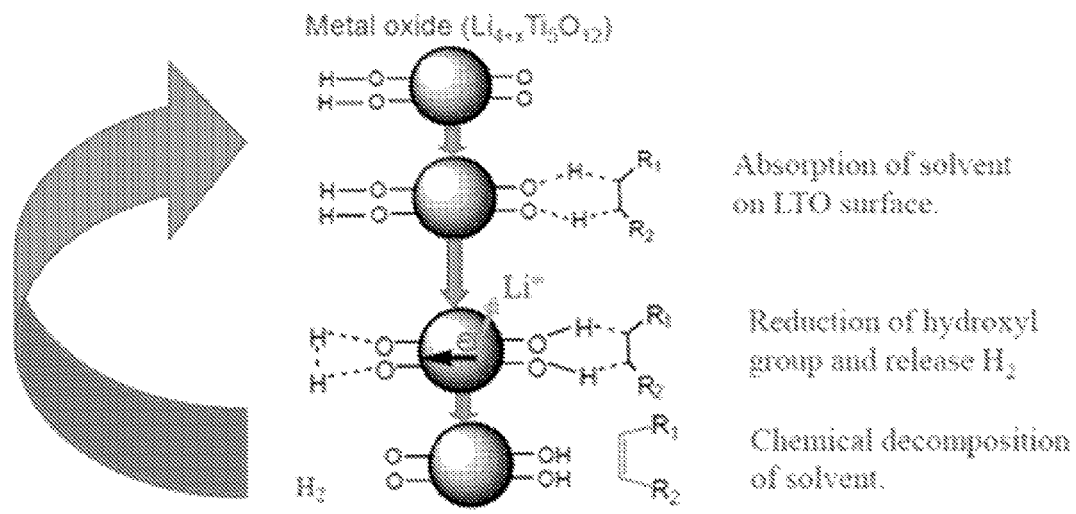
FIG. 1 shows a proposed mechanism of the solvent reduction on lithium titanium oxide in a Lithium ion cell according to Yan Qin, Zonghai Chen, Ilias Belharouak, and K. Amine (PI), Mechanism of LTO Gassing and potential solutions, DOE Merit Review Arlington, Va., May 9-13, 2011

It has been shown that some anode materials, such as lithium titanium oxide, catalyze the decomposition of the electrolyte. Decomposition of electrolyte results in gas generation, impedance increase, and decrease in the useful life of the battery. A proposed mechanism of electrolyte decomposition involves hydroxide groups on the electrochemically active material surface. An illustration of the mechanism is shown in FIG. 1. Other electrochemically active materials employed in lithium ion batteries have other properties, often imparted by surface species that introduce undesirable effects in the functioning or fabrication of the batteries. Certain embodiments of this disclosure concern surface modification of active materials utilized in lithium and lithium-ion batteries. Both cathode material and anode material benefit from the treatments described herein. The specific treatments disclosed herein are believed to help mitigate surface modification through the reaction of active materials on the electrode surface with gaseous chemicals. In certain embodiments, one or more gaseous compounds react with the surface species of a battery component to improve a property of the battery.

In addition, the performance of the material or battery may be impaired by traces of moisture. Reducing or fully eliminating this moisture can be beneficial.

Battery Components Modified

As mentioned, the method can be applied to modify the surface of the anode active materials and cathode active materials. Typically, though not necessarily, the electrode material to be modified is an electrode material for a lithium ion battery. Any of the materials described in this section may be gas treated in a lithiated or delithiated state. Further, when treated, these materials may have a morphology, shape, and size appropriate for battery applications, whether fully fabricated (e.g., completed cells) or partially fabricated (e.g., electrodes under construction).

Exemplary shapes of the material include round particles, squared particles, needles, plates, sheets, fibers, hollow tubes, porous particles, dense particles, flakes, spheres, and combinations of any of these. Exemplary average particle sizes are about 10 nm to about 50 μm, or about 1 μm to about 10 μm. Lithium titanate electrode material particles tend to have relatively small average dimensions, e.g., about 10 nm to about 400 nm, and they may sometimes have agglomerates of about 1 μm to about 10 μm. Certain carbon electrode materials tend to have relatively large average dimensions, e.g., about 1 μm to about 30 μm. The average values presented here represent the average largest/principal dimension of the particles. Some types of particles are not substantially spherical (e.g., they are shaped as flakes, rods, ovals, pillows, etc.) and therefore have two or more dimensions. It should also be noted that some materials have a large variance in particle size, with some particles being substantially larger or smaller than the endpoints of the average ranges set forth above.

The anode active materials include materials capable of intercalating or inserting an alkali metal ion such as lithium or sodium ions. Some of these materials are deployed in commercial lithium ion batteries, while others are under investigation for lithium ion batteries. Examples of anode active materials that can be surface modified in accordance with the methods disclosed herein include carbons (e.g., graphite, fullerenes, and graphene), silicon, tin, titanium, germanium, the oxides of any of these, the alloys of any of these, and the like. The method can also be applied to modify the surface of various types of cathode active materials. Classes of cathode materials include $LiMO_2$, $LiMPO_4$, $LiM_2O_4$, a lithium metal silicide, $MS_x$ (metal sulfide), $M_xO_y$ (metal oxide) where M is a metal such as V, Mn, Fe, Co, Ni, Al, Si, or a combination thereof. Examples of lithium metal oxides include $LiCoO_2$, $LiMnO_2$, lithium nickel oxides such as $LiNiO_2$, $LiNi_xCo_{1-x}O_2$, $LiNi_xCo_yMn_{(1-x-y)}O_2$, $LiNi_xCo_yAl_{(1-x-y)}O_2$ whereas $0<x<1$, $0<y<1$, lithium metal phosphates, and lithium mixed metal phosphates such as $LiFePO_4$, $LiMnPO_4$, $LiCoPO_4$, $LiFe_xMn_{1-x}PO_4$, $LiNi_xMn_{1-x}O_4$. The method can also be applied to decrease the amount of remaining moisture in materials, electrodes or cells, before filling them with electrolyte.

Gaseous Reactants

The gaseous compounds suitable for use in the methods described herein include gases that react with the surface of the active material and exist as gases in a temperature range in which the contact is performed.

As examples, the gaseous compounds used as reactants may include compounds containing carbon, oxygen, fluorine, sulfur, nitrogen and phosphorous. Gases containing chlorine or some other halogens can be used as well; however, sometimes halogens should be avoided for certain battery systems as they may result in poisoning of the electrode materials. Halogen containing gases can form acids such as HF, HCl, or HBr that may attack anode and cathode current collectors, the metal can, and other active materials in a cell. For certain materials, gaseous metal containing compounds such as tungsten hexafluoride or diiron hexabromide can be used.

The performance of lithium ion cells may suffer if metal impurities are present in the battery anode or cathode materials. Most commonly, metal impurities such as iron, nickel or manganese cause anode degradation. Metal impurities can be present on the anode surface from the very beginning or can migrate from the cathode in the form of metal ions and reduce on the anode surface. In lithium ion cells, the anode material is covered by Solid Electrolyte Interface (SEI), which is ionically conductive and electrically insulating. When metallic particles are present on an anode surface, they provide an electrically conductive path from the electrolyte to the anode active material particle. Metallic particles then undesirably cause the reduction of electrolyte, and self-discharge of the anode material. Thick deposits of electrolyte decomposition products increase impedance and result in battery performance degradation. Loss of lithium from the anode material causes capacity fade.

The compounds used as gas phase reactants in the present embodiments are gases at the temperature and pressure of the surface treatment. In various embodiments, a material that is a gas below about 200° C. may be suitable for the treatment. If the treatment is conducted at room temperature, then the reaction compound should be a gas at room temperature. Alternatively, the reaction compound may be a liquid that has a measureable vapor pressure at room temperature. In this case, treatment is possible if the reaction chamber is under vacuum and the vapors of the liquid reaction compound are introduced. In certain embodiments, gases containing carbon, sulfur, boron, oxygen, fluoride and/or hydrogen having a molecular weight below about 300 g/mol are employed.

Exemplary classes of compounds that may be used as gaseous reactants include hydrides, oxides, sulfides, oxysulfides, fluorides, chlorides and oxyfluorides of carbon, sulfur, phosphorus, silicon and boron. Other compounds, such as fluorinated or unfluorinated organic acids, ethers, esters and ketones with a boiling point below about 200° C. can be used. Many organic compounds of phosphorus, sulfur and boron can be utilized, as well.

In certain embodiments, one or more of the following gaseous compounds are employed: carbon dioxide ($CO_2$), carbon monoxide (CO), silane, boron trifluoride ($BF_3$), carbon tetrafluoride ($CF_4$), carbonyl fluoride ($COF_2$), carbonyl sulfide (COS), difluoromethane, fluoroform, forane, methyl fluoride, hexafluoropropylene, hydrogen sulfide, nitrogen trifluoride, phosphorus pentafluoride, perfluoropropane, sulfur dioxide, sulfur hexafluoride, sulfur tetrafluoride and their mixtures with each other and inert gases such as nitrogen, helium or argon.

In certain embodiments, one or more of the following liquid compounds are employed: silicon tetrachloride, thionyl chloride, sulfur dioxide, sulfuryl chloride.

It can be useful in some embodiments to dilute a gas that is highly reactive towards the surface of the active materials with an inert gas (e.g., nitrogen or a noble gas). For example, boron trifluoride may be combined with nitrogen in the ratio of from about 1:100,000 to about 1:1 (boron trifluoride:nitrogen). By combining the reactive gas with an inert gas, one may tailor the reactivity of the gas mixture so that the mixture modifies the properties of the active materials but does not damage other battery or electrode materials such as a binder or a separator. Another reason to use a mixture of gases is to reduce the cost of the process. In certain embodiments, the amount of reactive gas needed for treatment can be very small. Examples of mixtures of a reactive gas and an inert gas that can be used to treat lithium titanate or lithium nickel oxides (such as NCA and NCM) include (1) carbonyl sulfide with argon or nitrogen, (2) boron fluoride and argon or nitrogen, and (3) fluorine with argon.

In various embodiments, two or more gases may be employed together. In the surface modification reaction. As an example, one gas may react with the surface of the active material in a first reaction, and in a second reaction, a second gas may react with the products of the first reaction. Alternatively or in addition, one gas can react with the moisture present in the electrode material and another gas may react with the surface of the material being treated.

Gas-Solid Modification Couples

Various surface conditions can be treated in accordance with the methods disclosed herein. Among these conditions are excess moisture, the presence of reactive hydroxide groups, the presence of potentially soluble metal ions (e.g., $Mn^{2+}$, $Mn^{3+}$, $Co^{2+}$, and $Ni^{2+}$) in the form of oxides or salts, the presence of carbonate, and the presence of potentially reactive oxides (e.g., titanate).

Some cathode oxides such as lithium manganese oxide, lithium nickel oxide, lithium nickel manganese cobalt oxide, and lithium nickel cobalt aluminum oxide are believed to lose soluble metal ions (e.g., $Mn^{2+}$, $Mn^{3+}$, $Co^{2+}$, or $Ni^{2+}$) to the electrolyte during normal cell operation. Some gas phase reactions of the embodiments herein trap the metal compounds in or on the electrode. Without this trapping effect, the metal compounds may dissolve or otherwise leech out into the electrolyte during battery operation. The trapping may be accomplished by, for example, oxidizing the metal ions on the surface and/or converting the oxide form of these ions to an insoluble metal salt (e.g., a fluoride or a sulfide). Thus, in some embodiments, the surface treatment comprises exposure of the active material to a gaseous oxidizing agent. In some embodiments, particles of the cathode material are exposed to fluorine to oxidize the relevant metal ions and/or form fluorides of those metals—e.g., $MnF_3$ $MnF_4$, $NiF_2$, $CoF_2$, and $CoF_3$.

In some embodiments, particles of an electrode active material are exposed to a reducing gas such as hydrogen at elevated temperature. In the case of metal containing cathode or anode materials, this exposure operation may convert some of the surface compound to a zero valence elemental metal such as metallic titanium (in the case of lithium titanate) or metallic manganese (in the case of a lithium manganese oxide). Optionally, the converted electrode material may be subsequently treated with an oxidizing agent to form an insoluble salt. For example, particles containing surface amounts of metallic titanium or metallic manganese may be exposed to elemental fluorine (or other fluorine containing gaseous reactant) to produce insoluble $TiF_3$, $TiF_4$, $MnF_3$, and/or $MnF_4$.

In still other embodiments, the particles of electrode material contain surface carbonate that is removed by exposure to a gaseous reactant, such as an acidic reactant. Without wishing to be bound by a particular theory, it is believed that the presence of metal carbonates on the cathode surface causes gassing problems observed in lithium ion cells. Therefore, it may be beneficial to treat active materials with a gaseous reactant that will remove surface carbonate. Examples of suitable gaseous reactants to remove surface carbonates include, but are not limited to, hydrogen sulfide, hydrogen, organic acids, and hydrides.

For materials having exposed hydroxyl groups (e.g., lithium nickel oxides such as lithium nickel cobalt aluminum oxide), the various gases may be employed to react with and deactivate the hydroxyl groups. Specific examples and general classes of such gases are illustrated in the schematic mechanisms shown in FIGS. 2A-2G.

Figure 2A:
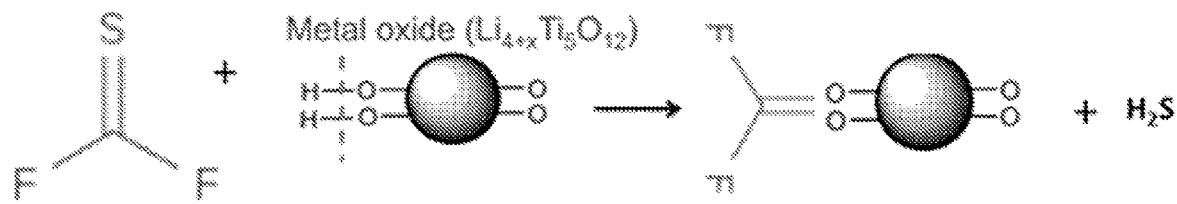
FIGS. 2A-2G show proposed reactions between gaseous precursors and hydroxyl groups on electrode surfaces.
Figure 2B:
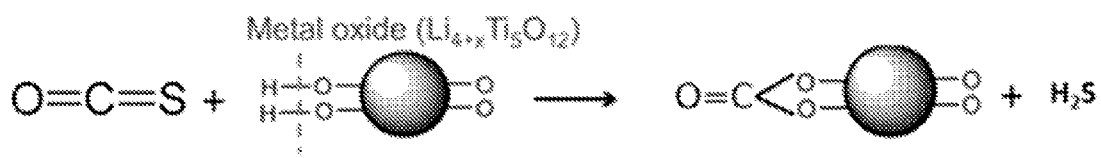

For sulfur containing gaseous compounds such as COS and thiocarbonyl fluoride, the sulfur may replace hydrogen from hydroxyl groups with a carbon-containing group (e.g., carbonyl or difluoro methylene) and generate $H_2S$. Examples of this type of reaction are shown in FIGS. 2A and 2B.

Figure 2C:
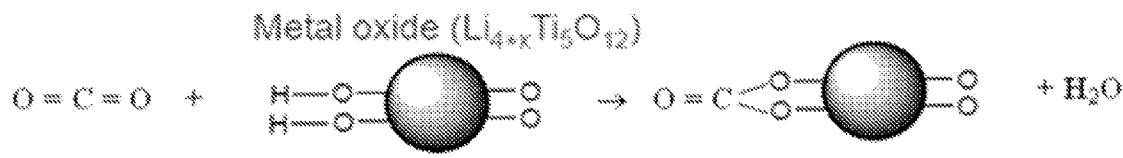
Figure 2D:
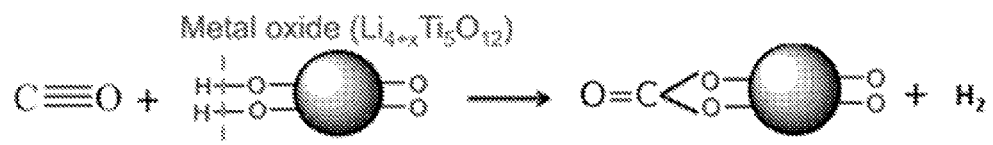

For oxygen containing gaseous compounds such as carbon dioxide and carbon monoxide, the surface reaction may also extract hydrogen atoms from the hydroxyl groups and form either $H_2O$ or $H_2$ depending on the choice of gaseous reactant. Examples of this type of reaction are shown in FIGS. 2C and 2D.

Figure 2E:
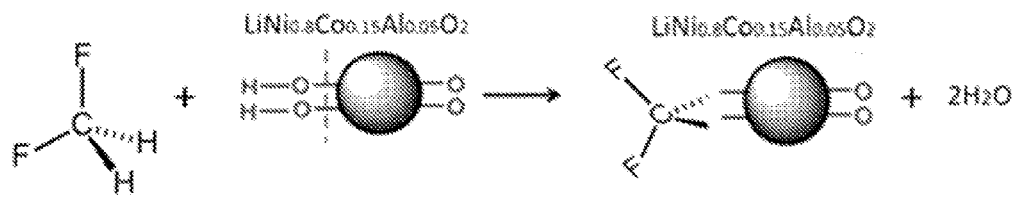
Figure 2F:
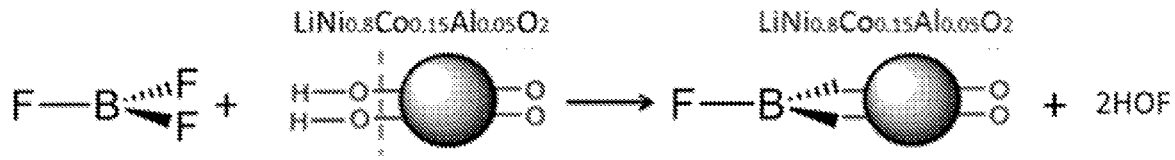
Figure 2G:
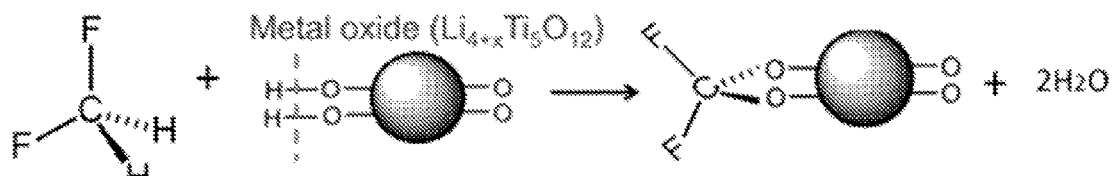
Figure 3A:
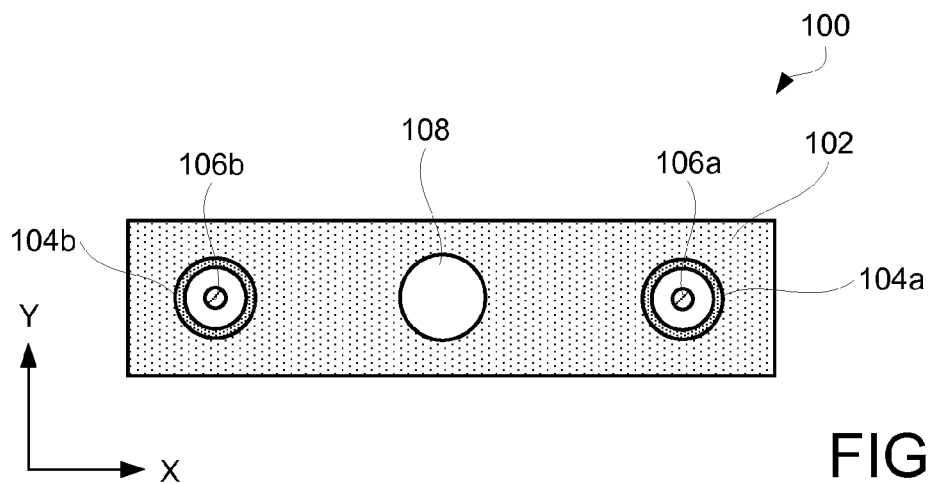
FIGS. 3A and 3B are schematic top and side views of a prismatic electrochemical cell, in accordance with certain embodiments.
Figure 3B:
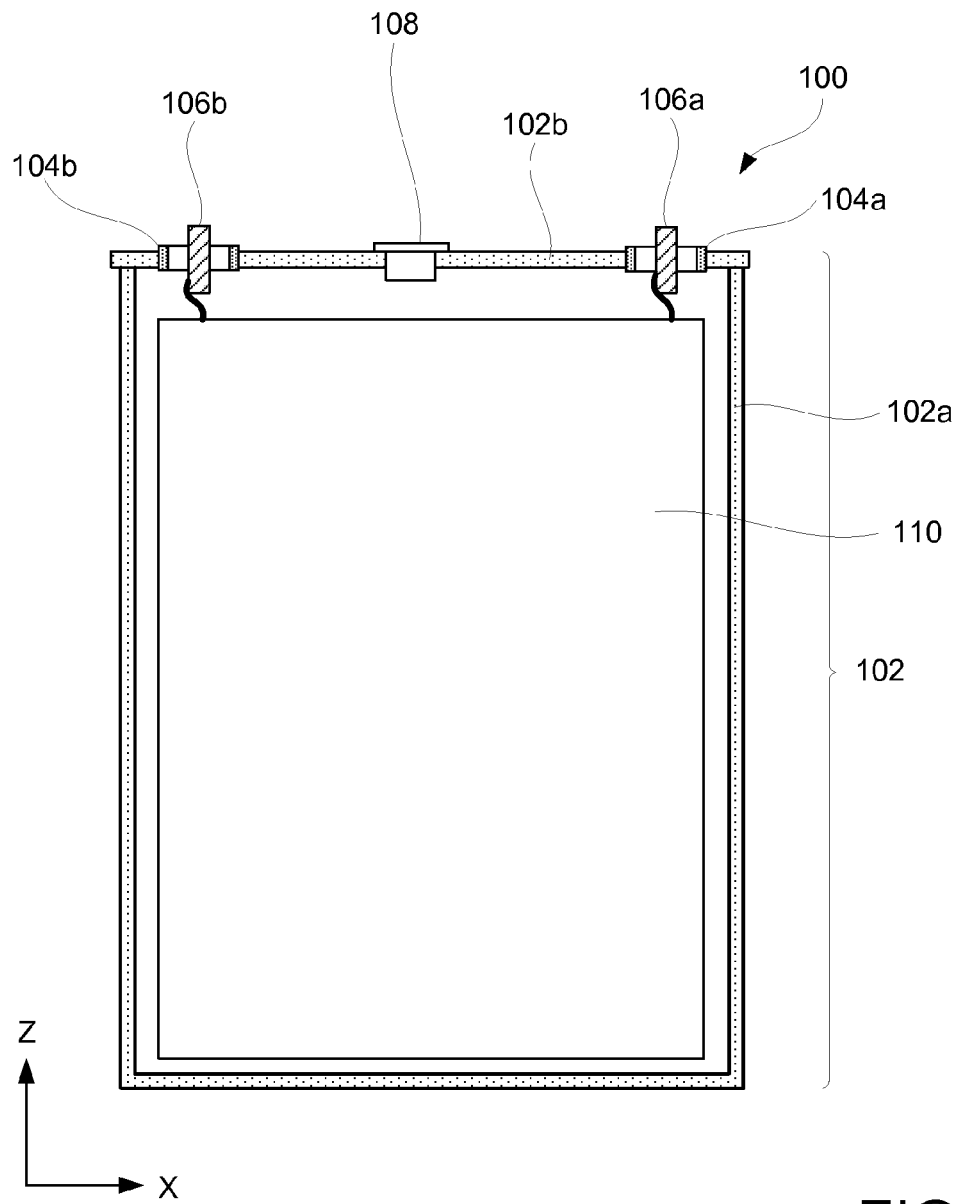
Figure 3C:
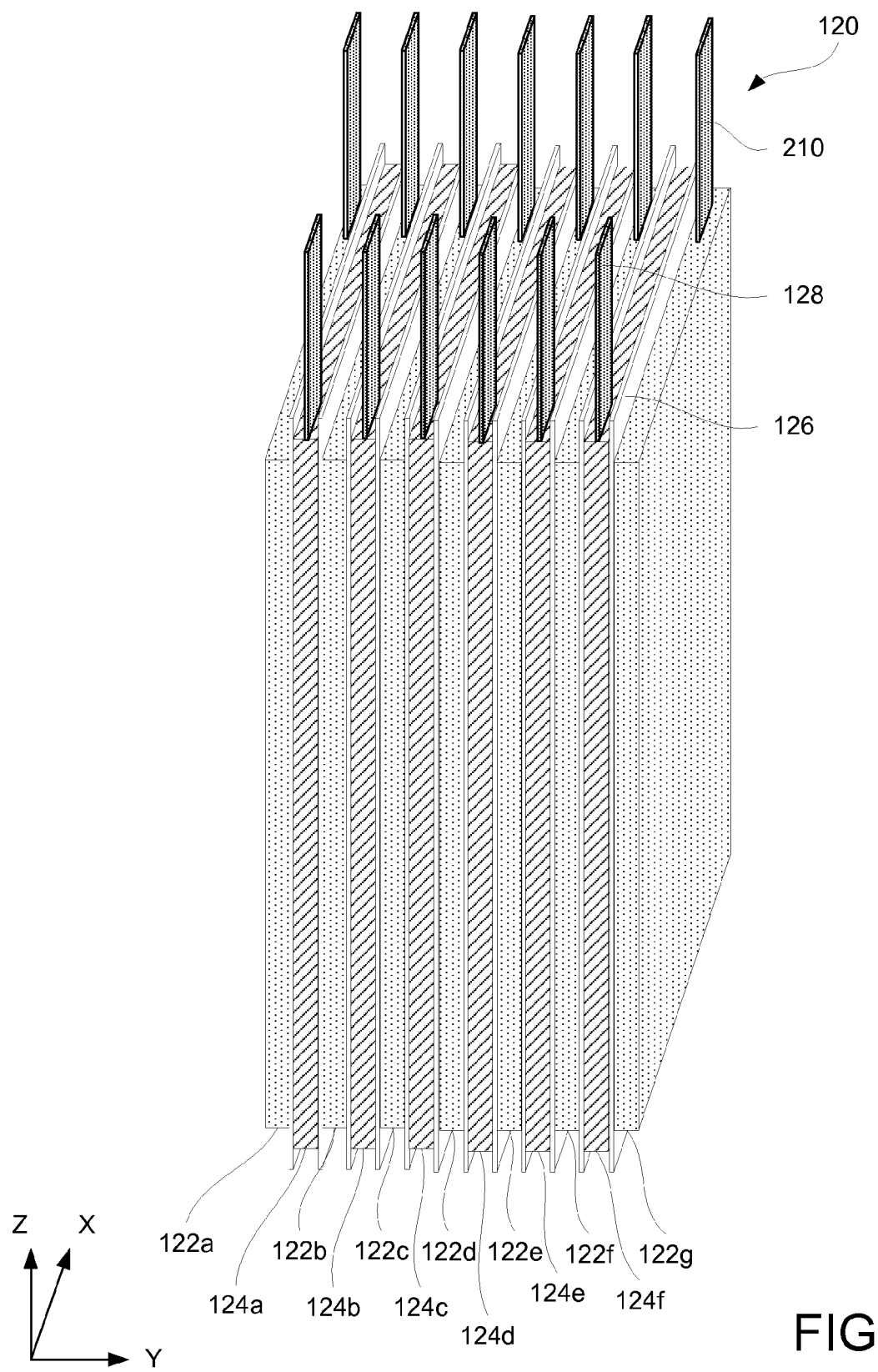
FIG. 3C is a schematic representation of an electrode stack in a prismatic electrochemical cell, in accordance with certain embodiments.

For hydrogen and halogen containing gaseous compounds such as difluoromethane and boron trifluoride, the reaction may attack the whole hydroxyl group and form $H_2O$ or HOF, or attack the hydrogen on the hydroxyl group and form HF or $H_2$. Examples of these types of reactions are shown in FIGS. 2E-2G.

Beneficial Results

Reduced gassing from electrolyte decomposition is one beneficial result of the surface treatments described herein. Removal of hydroxide groups is one mechanism for accomplishing this result.

Other benefits of the surface treatments described herein (which may act via any of the above-described, or similar mechanisms) include improved high temperature stability of the material, surface stability, increased rate capability, stability towards electrolytes at higher voltages, compatibility with particular solvents such as propylene carbonate or other carbonate, ester or ionic liquid based solvent and increased functionality in solutions containing electrolyte salts such as lithium imides, $LiPF_6$, $LiBF_4$, LiBOB.

The surface treatment may also decrease metal dissolution of the active material, reduce catalytic activity towards electrolyte, and thereby achieve a corresponding reduction in parasitic reactions and self-discharge. A stable interface between the active material and electrolyte may also result in better durability in terms of crystal structure breakdown. Some active materials, particularly certain cathode materials, undergo significant morphological rearrangements at certain stages of the charge-discharge cycle. For example, the crystallographic lattice structure may fundamentally transform from one state of charge to another when the electrode goes to a deep discharge. Sometimes, the particles may mechanically crack under the stress created by changes in the crystal structure. This cracking may be prevented by modifying the structure or morphology of the particle surfaces while preserving the native structure in the core. As an example, particles having a principal dimension of about 30-40 nm are modified to a depth of about 1-5 nm at their surfaces. The surface regions are modified so that they do not exhibit the characteristic crystallographic reorientations during cycling. Further, if the active material surface is exposed to electrolyte, the metal from the metal oxide may dissolve or leach out, and thereby affect the crystal structure of the material on the surface. If the active material is first treated or covered by some particular compound such as a fluoride salt of the metal, the active material may be stabilized and resist breakdown from exposure to the electrolyte or other influence.

Fabrication Stage when the Gas Phase Modification is Performed

Depending on a particular material being treated, the surface modification can be carried out at any of the following stages in the overall battery manufacturing process:

(1) Surface treatment is carried out on a raw material, such as an active powder or active powder mixed with conductive additives, but before it is made into a paste or slurry suitable for producing an electrode.

(2) Surface treatment is carried out on a coated electrode, compressed or uncompressed.

(3) Surface treatment is carried out after electrode drying prior to battery assembly.

(4) Surface treatment is carried out after the electrode stack or a jelly roll is fabricated or after a whole battery is assembled but before filling it with electrolyte.

Treatment at stages 3 and 4 is sometimes desired in order to avoid exposure of the modified active materials to air and moisture after the gas phase modification. When the active material is exposed to treatment in stages 3 or 4, moisture and oxygen will have little, if any, detrimental effect on the groups and compounds formed on the electrode material surface. It should be noted that cells containing lithium titanium oxide anode active material are particularly susceptible to degradation from exposure to ambient conditions. Therefore, such cells are preferably treated during stage 4, and in some cases during stage 3.

Process Conditions

1. Contact Temperature

In certain examples, when the surface modification step is carried out at stage 1, the temperature employed in the contact method is between about 0° C. to 800° C. Because battery electrodes, as well the active materials themselves, typically include additional compounds at stages 2-4, the temperature of the treatment may be limited by the thermal stability of conductive additives, binders, and/or other additives in the electrode.

For lithium ion cells, which may incorporate polyvinylidene fluoride, or carboxymethyl cellulose or a salt of carboxymethyl cellulose, and styrene butadiene rubber, the surface modification temperature may be limited to approximately 130-200° C., because higher temperatures may melt or degrade the binder material.

Where the treatment takes place during stage 4, the maximum temperature of the treatment is sometimes limited to approximately 60-180° C., and more often to about 60-120° C. Exposure to higher temperatures may cause shrinking or melting of many commonly used separator materials including polypropylene and polyethylene. When high temperature separators made of compounds such as cellulose, polyethylene terephthalate or aramid are employed, the treatment temperature can reach about 200° C.

2. Other Contact Conditions

Generally, it is convenient to carry out the treatment of the material after drying by introducing the gas directly into a vacuum oven used for drying. In some embodiments, the treatment can be carried out at an increased pressure, e.g., up to about 100 atmospheres, or at a lower pressure, e.g., down to about 0.01 KPa.

The duration of the treatment depends on the reactivity of the material surface towards the gas. In some embodiments, the contact time is no longer than about 72 hours, and more typically is no longer than about 2 hours.

Additionally, other types of processing may be used in conjunction with a gas phase process to facilitate the reaction or provide an additional reaction/transformation. Such processing may be conducted either at the same time as, or prior to, or after the gas phase process. Example of such other processing may include high-temperature treatments, irradiation with x-rays or other forms of electromagnetic radiation, ultrasonic agitation, other forms of mechanical stimulation, etc.

For example, in case of a material powder, during the treatment, the material may undergo mechanical disruption to enhance the surface treatment and/or achieve more thorough treatment. As specific examples, the material may be stirred, shaken, ball-milled, blown or otherwise dispersed. Additional treatment with X-ray, infrared, and/or ultraviolet radiation may be of a benefit in some embodiments. This may server to cross-link polymeric additives or otherwise impact the morphology or chemical structure of the electrode material.

3. Additional Processing (Prior to or after the Gas Phase Reaction)

Optionally, the gas phase reaction may be performed with one or more accompanying procedures that do not directly facilitate chemical transformation of the active material surface. Such additional procedures may be performed immediately prior to or immediately after the gas phase reaction. As used herein, immediately prior to or immediately after means that the two procedures occur without an additional procedure in between. In certain implementations, however, there may be a waiting time between the two procedures. It may be necessary, for example, to remove by products produced by the gas phase reaction. Other requirements may include drying the active material, physically or chemically activating the material, etc.

Pre-reaction processing can include, but is not limited to, drying by heating, or exposure to vacuum or both. Additionally, the material may be pre-processed by ball-milling, sintering or other mechanical treatments.

Post-reaction treatment can include, but is not limited to, removing the products of the reactions by heating, exposure to vacuum, flushing with inert gas, or repetitive vacuum-air flush steps. Alternatively, the treated materials or materials incorporated into the electrodes can be washed in one or more aqueous or organic solvents.

Cell Design and Fabrication

Rechargeable batteries are used for many applications such as automotive (starters, electrical vehicles, hybrid electrical vehicles), portable consumer devices, tools, uninterruptible power supplies, grid balancing, medical, aerospace, and many other applications. Designers constantly strive to improve cost, capacity, rate capabilities, and cycling characteristics of rechargeable batteries. Different applications require combinations of these and other characteristics. For example, hybrid electrical vehicles require large batteries with high charge and discharge rate capabilities, while consumer electronics need smaller batteries with large capacity.

Specific selection of active materials achieves some of these requirements. Lithium titanate, which is often referred to as lithium titanium oxide (LTO), and which has a chemical formula of $Li_4Ti_5O_{12}$, is an anode active material with exceptional charge-discharge characteristics. Lithium-titanate nanocrystals have a surface area that is sometimes more than 30 times greater than the surface area of the carbon active material, which is conventionally used in lithium ion batteries. The higher surface area allows faster insertion and removal of lithium during cycling, which is evidenced by high charge and discharge rates.

Electrochemical Cells

The embodiments described herein may be used in prismatic and cylindrical electrochemical cells. For purposes of this document, a prismatic electrochemical cell is defined as a cell having a rectangular profile within a plane perpendicular to the length of the cell. In other words, the prismatic cell has a rectangular profile within a plane formed by its thickness and width. Prismatic cells should be distinguished from round (cylindrical) cells that have a circular profile within this plane.

Prismatic cells generally conform better to battery cases and other enclosures, as compared to round cells. This is especially true where multiple cells are packed side by side in the enclosure. Further, in a stack design, prismatic stacked cells tend to have better current delivery capabilities, as there are multiple cathodes and multiple anodes and corresponding tabs forming such cells. Round cells typically have a single cathode, single anode, and one or more tabs attached to each electrode. As such, prismatic cells may be made into larger formats and have larger capacities. In certain embodiments, an electrochemical cell including a venting device has a capacity of at least about 1.0 Ah or, more specifically, a capacity of at least about 5 Ah.

Mechanical Components—Cases, Headers, Terminals, Venting Devices

A rechargeable electrochemical cell includes one or more pairs of positive and negative electrodes, electrolyte providing ionic communication between the electrodes, and an enclosure assembly containing the electrodes and electrolyte. The enclosure assembly may have multiple components that provide mechanical enclosure and electrical communication functions. FIGS. 1A and 1B are schematic representations of an electrochemical cell 100 illustrating some of these components, in accordance with certain embodiments. Cell 100 includes an enclosure assembly 102 that surrounds and encloses an electrode assembly 110. Enclosure assembly 102 is shown to include a case 102a and header 102b attached to case 102a. Enclosure assembly 102 may include other components, such as a case bottom, various seals and insulating gaskets, which are not specifically shown in FIGS. 1A and 1B.

Header 102b is shown to include feed-throughs 104a and 104b and venting device 108. One of these components may be used as a fill plug or a separate component may be provided and used as a fill plug. Feed-throughs 104a and 104b include corresponding conductive elements 106a and 106b that provide electronic communication to respective electrodes in electrode assembly 110 as further described with reference to FIG. 1C. In certain embodiments, external components of conductive elements 106a and 106b may be used as cell terminals for making electrical connections to the battery. Conductive elements 106a and 106b may be insulated from header 102b. In other embodiments, header 102b and/or 102a may provide one or both electronic paths to the electrodes in electrode assembly 110. In these embodiments, a cell may have only one feed-through or no feed-throughs at all.

In certain embodiments (not shown), the feed-throughs and/or venting device may be supported by other components of enclosure assembly 102, such as the case and/or bottom. Further, the feed-throughs and/or venting device may be integrated into a header or other components of the enclosure assembly during fabrication of these components or during assembly of the cell. The latter case allows more flexibility in design and production.

Components of enclosure assembly 102 may be made from electrically insulating materials, such as various polymers and plastics. These materials need to be mechanically/chemically/electrochemically stable at the specific operating conditions of the cell, including but not limited to electrolytes, operating temperature ranges, and internal pressure build-ups. Some examples of such materials include polyamine, polyethylene, polypropylene, polyimide, polyvinylidene fluoride, polytetrafluoroethylene, and polyethylene terephthalate. Other polymers and copolymers may be used as well. In certain embodiments, components of enclosure assembly 102 may be made from conductive materials. In these embodiments, one or more components may be used to provide electronic communication to the electrodes. When multiple conductive components are used for enclosure assembly 102, these conductive components may be insulated with respect to each other using insulating gaskets.

Conductive elements 106a and 106b may be made of various conductive materials such as any metal or metallic alloy. These conductive materials may be isolated from any contact with electrolyte (e.g., external components or components having protective sheaths) and/or electrochemically stable at operating potentials if exposed to electrolyte. Some examples of conductive materials include steel, nickel, aluminum, nickel, copper, lead, zinc and their alloys.

When enclosure assembly 102 includes multiple components, such as case 102a and header 102b, these components may be sealed with respect to each other. The sealing process used depends on the materials used for the components, and may involve heat sealing, adhesive application (e.g., epoxies), and/or welding (e.g., laser welding, ultrasonic welding, etc.). This sealing is performed after inserting electrode assembly 110 into enclosure assembly 102 and typically prior to filling electrolyte into enclosure assembly 102. Enclosure assembly 102 may be then sealed by installing venting device 108 or some other means. However, in certain embodiments the sealing may occur before electrolyte is introduced into the enclosure assembly 102. In such embodiments, the enclosure assembly should provide a mechanism for filling electrolyte after such sealing has taken place. In one example, the enclosure assembly 102 includes a filling hole and plug (not shown).

Electrode Arrangements

Electrode assembly 110 includes at least one cathode and one anode. These two types of electrodes are typically arranged such that they face one another and extend alongside one another within the enclosure assembly 102. A separator may be provided between two adjacent electrodes to provide electric insulation while also allowing ionic mobility between the two electrodes through pores in the separator. The ionic mobility is provided by electrolyte that soaks the electrodes and separator.

The electrodes are typically much thinner than the internal spacing of enclosure assembly 102. In order to fill this space, electrodes may be arranged into stacks and jellyrolls. In a jellyroll, one cathode and one anode are wound around the same axis (in case of round cells) or around an elongated shape (in case of prismatic cells). Each electrode has one or more current collecting tabs extending from that electrode to one of conductive elements 106a and 106b of feed-throughs 104a and 104b, or to some other conductive component or components for transmitting an electrical current to the electrical terminals of the cell.

In a stackable cell configuration, multiple cathodes and anodes may be arranged as parallel alternating layer. One example of a stackable electrode assembly 120 is shown in FIG. 1C. Electrode assembly 120 is shown to include seven cathodes 122a-122g and six anodes 124a-124f. Adjacent cathodes and anodes are separated by separator sheets 126 to electrically insulate the adjacent electrodes while providing ionic communication between these electrodes. Each electrode may include a conductive substrate (e.g., metal foil) and one or two active material layers supported by the conductive substrate. Each negative active material layer is paired with one positive active material layer. In the example presented in FIG. 1C, outer cathodes 122a and 122g include only one positive active material facing towards the center of assembly 120. All the other cathodes and anodes have two active material layers. One having ordinary skill in the art would understand that any number of electrodes and pairing of electrodes may be used. Conductive tabs may be used to provide electronic communication between electrodes and conductive elements, for example. In certain embodiments, each electrode in electrode assembly 120 has its own tab. Specifically, cathodes 122a-122g are shown to have positive tabs 210, while anodes 124a-124f are shown to have negative tabs.

Figure 4A:
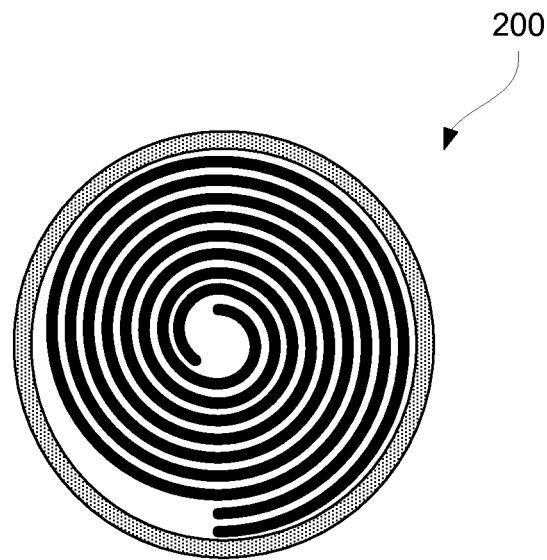
FIGS. 4A and 4B are schematic top and side views of a wound electrochemical cell, in accordance with certain embodiments.
Figure 4B:
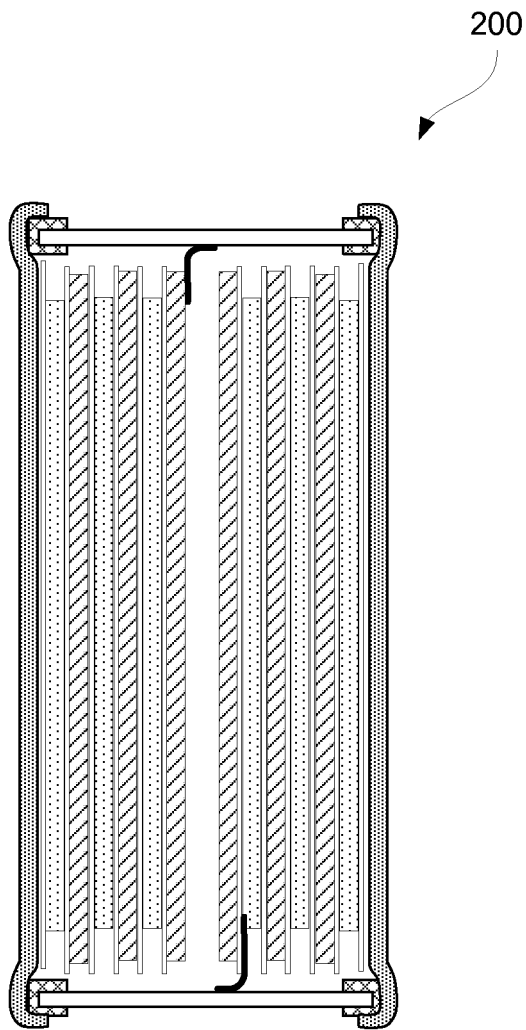

FIGS. 4A and 4B illustrate a wound cell example 200, in which two electrodes are wound into a jellyroll.

Electrochemically Active Materials and Electrolytes

In certain embodiments, a cathode includes one or more active materials and a current collector. The cathode may have an upper charging voltage of about 3.5-4.5 volts versus a Li/Li$^+$ reference electrode. The upper charging voltage is the maximum voltage to which the cathode may be charged at a low rate of charge and with significant reversible storage capacity. In some embodiments, cells utilizing a cathode with upper charging voltages from about 3-5.8 volts versus a Li/Li$^+$ reference electrode are also suitable. In certain instances, the upper charging voltages are from about 3-4.2 volts, about 4.0-5.8 volts, or about 4.5-5.8 volts. In certain instances, the cathode has an upper charging voltage of about 5 volts. For example, the cell can have an upper charging voltage of about 4.9, 5.0, 5.1, 5.2, 5.3, 5.4, 5.5, 5.6, 5.7 or 5.8 volts. A variety of cathode active materials can be used. Non-limiting exemplary electrode active materials include transition metal oxides, phosphates and sulfates, and lithiated transition metal oxides, phosphates and sulfates.

In some embodiments, the electrode active materials are oxides with empirical formula $Li_xMO_2$, where M is a transition metal selected from the group consisting of Mn, Fe, Co, Ni, Al, Mg, Ti, V, Si and a combination thereof, with a layered crystal structure. The value x may be between about 0.01 and about 1, between about 0.5 and about 1, or between about 0.9 and about 1.

In other embodiments, the electrode active materials are oxides with the formula $Li_xM1_aM2_bM3_cO_2$, where M1, M2, and M3 are each independently a transition metal selected from the group Mn, Fe, Co, Ni, Al, Mg, Ti, V or Si. The subscripts a, b and c are each independently a real number between about 0 and 1 ($0 \leq a \leq 1$; $0 \leq b < 1$; $0 \leq c \leq 1$; $0.01 \leq x \leq 1$), with the proviso that a+b+c is about 1.

In certain instances, the electrode active materials are oxides with the empirical formula $Li_xNi_aCo_bMn_cO_2$, wherein the subscript x is between about 0.01 and 1 (e.g., x is 1); the subscripts a, b and c are each independently 0, 0.1, 0.2, 0.3, 0.4, 0.5, 0.6, 0.7, 0.9 or 1, with the proviso that a+b+c is 1. In other instances, the subscripts a, b and c are each independently between about 0-0.5, between about 0.1-0.6, between about 0.4-0.7, between about 0.5-0.8, between about 0.5-1 or between about 0.7-1 with the proviso that a+b+c is about 1.

In yet other embodiments, the active materials are oxides with the empirical formula $Li_{1+x}A_yM_{2-y}O_4$, where A and M are each independently a transition metal selected from the group consisting of Fe, Mn, Co, Ni, Al, Mg, Ti, V, Si, and a combination thereof, with a spinel crystal structure. The value x may be between about −0.11 and 0.33, or between about 0 and about 0.1. The value of y may be between about 0 and 0.33, or between 0 and about 0.1. In one embodiment, A is Ni, x is 0 and y is 0.5 (i.e., the active material is $LiA_{0.5}M_{1.5}O_4$).

In yet some other embodiments the active materials are vanadium oxides such as $LiV_2O_5$, $LiV_6O_{13}$, or the foregoing compounds modified in that the compositions thereof are nonstoichiometric, disordered, amorphous, overlithiated or underlithiated.

The suitable cathode-active compounds may be further modified by doping with about 5% or less of divalent or trivalent metallic cations such as $Fe^{2+}$, $Ti^{2+}$, $Zn^{2+}$, $Ni^{2+}$, $Co^{2+}$, $Cu^{2+}$, $Mg^{2+}$, $Cr^{3+}$, $Fe^{3+}$, $Al^{3+}$, $Ni^{3+}$ $Co^{3+}$, or $Mn^{3+}$, and the like. In other embodiments, cathode active materials suitable for the cathode composition include lithium insertion compounds with olivine structure such as $Li_xMXO_4$ where M is a transition metal selected from the group consisting of Fe, Mn, Co, Ni, and a combination thereof, and X is a selected from a group consisting of P, V, S, Si and combinations thereof, and the value of the value x is between about 0 and 2. In certain instances, the compound is $LiMXO_4$. In some embodiments, the lithium insertion compounds include $LiMnPO_4$, $LiVPO_4$, $LiCoPO_4$ and the like. In other embodiments, the active materials have NASICON structures such as $Y_xM_2(XO_4)_3$, where Y is Li or Na, or a combination thereof, M is a transition metal ion selected from the group consisting of Fe, V, Nb, Ti, Co, Ni, Al, or the combinations thereof, and X is selected from a group consisting of P, S, Si, and combinations thereof, and the value of x is between 0 and 3. Examples of these materials are disclosed by J. B. Goodenough in "Lithium Ion Batteries" (Wiley-VCH press, Edited by M. Wasihara and O. Yamamoto). Particle size of the electrode materials may be between about 1 nm and about 100 μm, or between about 10 nm and about 100 μm, or between about 1 μm and 100 μm.

In other embodiments, the electrode active materials are oxides such as $LiCoO_2$, spinel $LiMn_2O_4$, chromium-doped spinel lithium manganese oxides $Li_xCr_yMn_2O_4$, layered $LiMnO_2$, $LiNiO_2$, or $LiNi_xCo_{1-z}O_2$, where x is between about 0 and 1, or between about 0.5 and about 0.95. The electrode active materials may also be vanadium oxides such as $LiV_2O_5$, $LiV_6O_{13}$, or the foregoing compounds modified in that the compositions thereof are nonstoichiometric, disordered, amorphous, overlithiated or underlithiated.

The suitable cathode-active compounds may be further modified by doping with about 5% or less of divalent or trivalent metallic cations such as $Fe^{2+}$, $Ti^{2+}$, $Zn^{2+}$, $Ni^{2+}$, $Co^{2+}$, $Cu^{2+}$, $Mg^{2+}$, $Cr^{3+}$, $Fe^{3+}$, $Al^{3+}$, $Ni^{3+}$ $Co^{3+}$, or $Mn^{3+}$, and the like. In yet other embodiments, cathode active materials suitable for the cathode composition include lithium insertion compounds with olivine structure such as $LiFePO_4$ and with NASICON structures such as $LiFeTi(SO_4)_3$. In still other embodiments, electrode active materials include $LiFePO_4$, $LiMnPO_4$, $LiVPO_4$, $LiFeTi(SO_4)_3$, $LiNi_xMn_{1-x}O_2$, $LiNi_xCo_yMn_{1-x-y}O_2$ and derivatives thereof, wherein x and y are each between about 0 and 1. In certain instances, x is between about 0.25 and 0.9. In one instance, x is ⅓ and y is ⅓. Particle size of the cathode active material should range from about 1 to 100 microns.

In some embodiments, the electrode-active material includes transition metal oxides such as $LiCoO_2$, $LiMn_2O_4$, $LiNiO_2$, $LiNi_xMn_{1-x}O_2$, $LiNi_xCo_yMn_{1-x-y}O_2$ and their derivatives, where x and y are each between about 0 and 1.

$LiNi_xMn_{1-x}O_2$ can be prepared by heating a stoichiometric mixture of electrolytic $MnO_2$, LiOH and nickel oxide to between about 300 and 400° C. In certain embodiments, the electrode active materials are $xLi_2MnO_3(1-x)LiMO_2$ or $LiM'PO_4$, where M is selected from the group consisting of Ni, Co, Mn, $LiNiO_2$ or $LiNi_xCo_{1-x}O_2$; M' is selected from the group consisting of Fe, Ni, Mn and V; and x and y are each independently a real number between about 0 and 1. $LiNi_{x-}Co_yMn_{1-x-y}O_2$ can be prepared by heating a stoichiometric mixture of electrolytic $MnO_2$, LiOH, nickel oxide and cobalt oxide to between about 300 and 500° C. The cathode may contain conductive additives from 0% to about 90%. In one embodiment, the subscripts x and y are each independently selected from 0.1, 0.15, 0.2, 0.25, 0.3, 0.35, 0.4, 0.45, 0.5, 0.55, 0.6, 0.65, 0.7, 0.75, 0.8, 0.85, 0.9 or 0.95. x and y can be any numbers between 0 and 1 to satisfy the charge balance of the compounds $LiNi_xMn_{1-x}O_2$ and $LiNi_xCo_yMn_{1-x-y}O_2$.

Representative cathodes and their approximate recharged potentials include $FeS_2$ (3.0 V vs. $Li/Li^+$), $LiCoPO_4$ (4.8 V vs. $Li/Li^+$), $LiFePO_4$ (3.45 V vs. $Li/Li^+$), $Li_2FeS_2$ (3.0 V vs. $Li/Li^+$), $Li_2FeSiO_4$ (2.9 V vs. $Li/Li^+$), $LiMn_2O_4$ (4.1 V vs. $Li/L^{+}$), $LiMnPO_4$ (4.1 V vs. $Li/L^{+}$), $LiNiPO_4$ (5.1 V vs. $Li/Li^+$), $LiV_3O_8$ (3.7 V vs. $Li/Li^+$), $LiV_6O_{13}$ (3.0 V vs. $Li/Li^+$), $LiVOPO_4$ (4.15 V vs. $Li/Li^+$), $LiVOPO_4F$ (4.3 V vs. $Li/Li^+$), $Li_3V_2(PO_4)_3$ (4.1 V (2 Li) or 4.6 V (3 Li) vs. $Li/Li^+$), $MnO_2$ (3.4 V vs. $Li/Li^+$), $MoS_3$ (2.5 V vs. $Li/Li^+$), sulfur (2.4 V vs. $Li/Li^+$), $TiS_2$ (2.5 V vs. $Li/Li^+$), $TiS_3$ (2.5 V vs. $Li/Li^+$), $V_2O_5$ (3.6 V vs. $Li/Li^-$), and $V_6O_{13}$ (3.0 V vs. $Li/Li^+$) and combinations thereof.

A cathode can be formed by mixing and forming a composition comprising, by weight, between about 0.01-15% (e.g., between about 4-8%) polymer binder, between about 10-50% (e.g., between about 15-25%) electrolyte solution as herein described, between about 40-85% (e.g., between about 65-75%) electrode-active material, and between about 1-12% (e.g., between about 4-8%) conductive additive. An inert filler may also be added up to about 12% by weight, though in certain cases no inert filler is used. Other additives may be included, as well.

An anode may include active materials and a current collector. The anode comprises either a metal selected from the group consisting of Li, Si, Sn, Sb, Al and a combination thereof, or a mixture of one or more anode active materials in particulate form, a binder (in certain cases a polymeric binder), optionally an electron conductive additive, and at least one organic carbonate. Examples of useful anode active materials include, but are not limited to, lithium metal, carbon (graphites, coke-type, mesocarbons, polyacenes, carbon nanotubes, carbon fibers, and the like). Anode-active materials also include lithium-intercalated carbon, lithium metal nitrides such as $Li_{2.6}Co_{0.4}N$, metallic lithium alloys such as LiAl, $Li_4Sn$, or lithium-alloy-forming compounds of tin, silicon, antimony, or aluminum. Further included as anode-active materials are metal oxides such as titanium oxides, iron oxides, or tin oxides.

When present in particulate form, the particle size of the anode active material should range from about 0.01 to 100 microns, e.g., from about 1 to 100 microns. In some cases the anode active materials include graphites such as carbon microbeads, natural graphites, carbon nanotubes, carbon fibers, or graphitic flake-type materials. Alternatively or in addition, the anode active materials may be graphite microbeads and hard carbon, which are commercially available.

An anode can be formed by mixing and forming a composition comprising, by weight, between about 2-20% (e.g., 3-10%) polymer binder, between about 10-50% (e.g., between about 14-28%) electrolyte solution as described herein, between about 40-80% (e.g., between about 60-70%) electrode-active material, and between about 0-5% (e.g., between about 1-4%) conductive additive. In certain cases an inert filler is added up to about 12% by weight, though in other cases no filler is used. Additional additives may also be present.

Suitable conductive additives for the cathode and anode composition include carbons such as coke, carbon black, carbon nanotubes, carbon fibers, and natural graphite, metallic flake or particles of copper, stainless steel, nickel or other relatively inert metals, conductive metal oxides such as titanium oxides or ruthenium oxides, or electrically-conductive polymers such as polyacetylene, polyphenylene and polyphenylenevinylene, polyaniline or polypyrrole. Additives may include, but are not limited to, carbon fibers, carbon nanotubes and carbon blacks with a surface area below about 100 $m^2/g$ such as Super P and Super S carbon blacks available from MMM Carbon in Belgium.

The current collector suitable for the cathode and anode includes a metal foil and a carbon sheet selected from a graphite sheet, carbon fiber sheet, carbon foam and carbon nanotube sheet or film. High conductivity is generally achieved in pure graphite and pure carbon nanotube films. Therefore, the graphite and nanotube sheeting should contain as few binders, additives and impurities as possible in order to realize the benefits of the present embodiments. Carbon nanotubes can be present from about 0.01% to about 99% by weight. The carbon fiber can be in the micron or submicron range. Carbon black or carbon nanotubes may be added to enhance the conductivities of certain carbon fibers. In one embodiment, the anode current collector is a metal foil, such as copper foil. The metal foil can have a thickness between about 5 and about 300 micrometers.

The carbon sheet current collector suitable for the present invention may be in the form of a powder coating on a substrate such as a metal substrate, a free-standing sheet, or a laminate. In other words, the current collector may be a composite structure having other members such as metal foils, adhesive layers, and such other materials as may be considered desirable for a given application. However, in any event, according to the present embodiments, it is the carbon sheet layer, or carbon sheet layer in combination with an adhesion promoter, which directly interfaces with the electrolyte and is in electrically conductive contact with the electrode surface.

Suitable binders include, but are not limited to, polymeric binders, particularly gelled polymer electrolytes comprising polyacrylonitrile, poly(methylmethacrylate), poly(vinyl chloride), and polyvinylidene fluoride and copolymers thereof. Also included are solid polymer electrolytes such as polyether-salt based electrolytes including poly(ethylene oxide)(PEO) and its derivatives, polypropylene oxide) (PPO) and its derivatives, and poly(organophosphazenes) with ethyleneoxy or other side groups. Other suitable binders include fluorinated ionomers comprising partially or fully fluorinated polymer backbones, and having pendant groups comprising fluorinated sulfonate, imide, or methide lithium salts. Preferred binders include polyvinylidene fluoride and copolymers thereof with hexafluoropropylene, tetrafluoroethylene, fluorovinyl ethers, such as perfluoromethyl, perfluoroethyl, or perfluoropropyl vinyl ethers; and ionomers comprising monomer units of polyvinylidene fluoride and monomer units comprising pendant groups comprising fluorinated carboxylate, sulfonate, imide, or methide lithium salts.

The electrochemical cell optionally contains an ion conductive layer or a separator. The ion conductive layer suitable for the lithium or lithium-ion battery of the present embodiments is any ion-permeable layer, preferably in the form of a thin film, membrane or sheet. Such ion conductive layer may be an ion conductive membrane or a microporous film such as a microporous polypropylene, polyethylene, polytetrafluoroethylene and layered structures thereof. Suitable ion conductive layers also include swellable polymers such as polyvinylidene fluoride and copolymers thereof. Other suitable ion conductive layers include gelled polymer electrolytes such as poly(methyl methacrylate) and poly(vinyl chloride). Also suitable are polyethers such as poly(ethylene oxide) and poly(propylene oxide). In some cases, preferable separators are microporous polyolefin separators or separators comprising copolymers of vinylidene fluoride with hexafluoropropylene, perfluoromethyl vinyl ether, perfluoroethyl vinyl ether, or perfluoropropyl vinyl ether, including combinations thereof, or fluorinated ionomers.

An electrolyte may include various carbonates, such as cyclic carbonates and linear carbonates. Some examples of cyclic carbonates include ethylene carbonate (EC), propylene carbonate (PC), butylene carbonate (BC), vinylene carbonate (VC), dimethylvinylene carbonate (DMVC), vinylethylene carbonate (VEC), and fluoroethylene carbonate (FEC). The cyclic carbonate compounds may include at least two compounds selected from the group consisting of ethylene carbonate, propylene carbonate, vinylene carbonate, vinylethylene carbonate, and fluoroethylene carbonate. Some examples of linear-carbonate compounds include linear carbonates having an alkyl group, such as dimethyl carbonate (DMC), methyl ethyl carbonate (MEC), diethyl carbonate (DEC), methyl propyl carbonate (MPC), dipropyl carbonate (DPC), methyl butyl carbonate (MBC) and dibutyl carbonate (DBC). The alkyl group can have a straight or branched chain structure.

Examples of other non-aqueous solvents include lactones such as gamma-butyrolactone (GBL), gamma-valerolactone, and alpha-angelica lactone; ethers such as tetrahydrofuran, 2-methyltetrahydrofuran, 1,4-dioxane, 1,2-dimethoxyethane, 1,2-diethoxyethane, and 1,2-dibutoxyethane; nitriles such as acetonitrile, and adiponitrile; linear esters such as methyl propionate, methyl pivalate, butyl pivalate, hexyl pivalate, octyl pivalate, dimethyl oxalate, ethyl methyl oxalate, and diethyl oxalate; amides such as dimethylformamide; and compounds having an S=O bonding such as glycol sulfite, propylene sulfite, glycol sulfate, propylene sulfate, divinyl sulfone, 1,3-propane sultone, 1,4-butane sultone, and 1,4-butanediol dimethane sulfonate.

Examples of combinations of the non-aqueous solvents include a combination of a cyclic carbonate and a linear carbonate, a combination of a cyclic carbonate and a lactone, a combination of a cyclic carbonate, a lactone and a linear ester, a combination of a cyclic carbonate, a linear carbonate and a lactone, a combination of a cyclic carbonate, a linear carbonate and an ether, and a combination of a cyclic carbonate, a linear carbonate and a linear ester. Preferred are the combination of a cyclic carbonate and a linear carbonate, and the combination of a cyclic carbonate, a linear carbonate and a linear ester.

Examples of electrolyte salts used in non-aqueous electrolytic solutions include: $LiPF_6$, $LiBF_4$, $LiClO_4$; lithium salts comprising a chain alkyl group such as $LiN(SO_2CF_3)_2$, $LiN(SO_2C_2F_5)_2$, $LiC(SO_2CF_3)_3$, $LiPF_4(CF_3)_2$, $LiPF_3(C_2F_5)_3$, $LiPF_3(CF_3)_3$, $LiPF_3(iso-C_3F_7)_3$, and $LiPF_5(iso-C_3F_7)$; and lithium salts comprising a cyclic alkylene group such as $(CF_2)_2(SO_2)2NLi$, and $(CF_2)_3(SO_2)_2NLi$. More preferred are $LiPF_6$, $LiBF_4$ and $LiN(SO_2CF_3)_2$, and most preferred is $LiPF_6$, though these preferential ingredients are in no way limiting.

The electrolyte salt can be used singly or in combination. Examples of the preferred combinations include a combination of $LiPF_6$ with $LiBF_4$, a combination of $LiPF_6$ with $LiN(SO_2CF_3)_2$, and a combination of $LiBF_4$ with $LiN(SO_2CF_3)_2$. Most preferred is the combination of $LiPF_6$ with $LiBF_4$, though again, these preferential combinations are in no way limiting. There is no specific limitation with respect to the mixing ratio of the two or more electrolyte salts. In the case that $LiPF_6$ is mixed with other electrolyte salts, the amount of the other electrolyte salts preferably is about 0.01 mole % or more, about 0.03 mole % or more, about 0.05 mole % or more based on the total amount of the electrolyte salts. The amount of the other electrolyte salts may be about 45 mole % or less based on the total amount of the electrolyte salts, about 20 mole % or less, about 10 mole % or less, or about 5 mole % or less. The concentration of the electrolyte salts in the non-aqueous solvent may be about 0.3 M or more, about 0.5 M or more, about 0.7 M or more, or about 0.8 M or more. Further, the electrolyte salt concentration preferably is about 2.5 M or less, about 2.0 M or less, about 1.6 M or less, or about 1.2 M or less.

Battery Packs

Provided herein are battery packs, each containing one or more electrochemical cells built with processed active materials. When a battery pack includes multiple cells, these cells may be configured in series, in parallel, or in various combinations of these two connection schemes. In addition to cells and interconnects (electrical leads), battery packs may include charge/discharge control systems, temperature sensors, current balancing systems, and other like components. For example, battery regulators may be used to keep the peak voltage of each individual cell below its maximum value so as to allow weaker batteries to be fully charged, bringing the whole pack back into balance. Active balancing can also be performed by battery balancer devices which can shuttle energy from stronger batteries to weaker ones in real time for improved balance.

EXAMPLE 1

This example concerns one embodiment of the present invention. In this example we treated lithium titanium oxide (LTO). It was shown that LTO catalyzes the reactions that result in gas evolution and increased impedance of the battery. One of the proposed mechanisms is shown in FIG. 1. It is believed beneficial, therefore, to eliminate the hydroxyl groups on the active material surface.

In this example, carbon dioxide was used to treat the LTO. It is believed that the hydroxide groups on the LTO surface react with carbon dioxide, thereby forming carbonate groups as shown in FIG. 2C.

First, electrode materials were used to prepare a slurry, and the slurry was then coated on aluminum foil:

Cathode coating was accomplished by mixing 92 wt % LMO powder (available from TODA America in Battle Creek, Mich.),), 2 wt % Super P—Li carbon (available from TIMCAL Graphite & Carbon in Bodio, Switzerland), 3 wt % KS6 graphite (available from TIMCAL Graphite & Carbon in Bodio, Switzerland), and 3 wt % KF1300 (available from KUREHA America Inc. in New York, N.Y.) in N-Methyl-2-pyrrolidone solvent at 72% solid content. Thin film coatings were cast on both sides of 16 μm aluminum foil at an area loading of 15 mg/cm² foil surface area. The coating film was then compressed to a density of 2.5 g/cm³. An anode coating was made by mixing 80 wt % LTO powder (available from TODA America in Battle Creek, Mich.), 5 wt % KS6 graphite (available from TIMCAL Graphite & Carbon in Bodio, Switzerland), 5 wt % Super P—Li carbon (available from TIMCAL Graphite & Carbon in Bodio, Switzerland), and 10 wt % KF W1300 (available from KUREHA America Inc. in New York, N.Y.) in N-Methyl-2-pyrrolidone solvent at 50% solid content. Thin film coatings were cast at area loading of 10 mg/cm²/side on both sides of 16 um aluminum foil. The coating film is then compressed to a density of 1.8 g/cm³.

Electrodes having a face of about 50 mm by 80 mm were punched, with clean foil protruding from one side of the electrode. Electrodes were dried for 16 hours under vacuum in the vacuum oven at 120° C. After drying, the vacuum oven was refilled with high purity carbon dioxide. After 1 hour, the oven was again exposed to vacuum, and refilled with carbon dioxide one more time. The electrodes were allowed to cool down under carbon dioxide atmosphere.

After assembling the electrodes into a lithium ion pouch cell with a 20 µm polypropylene separator (available from CELGARD in Charlotte, N.C.), the cells were sealed in a laminated aluminum foil pouch cell having material on 3 sides and dried under vacuum at 60° C. for 48 hours. After releasing the vacuum with carbon dioxide, the cells were filled with electrolyte of the following formulation: 1M $LiPF_6$, EC:EMC at a ratio of 1:4, 2% VC.

Afterwards, the cells went through C/10 charge/discharge formation cycle from 1.5 to 2.8V and went through final vacuum and seal.

EXAMPLE 2

Figure 5:
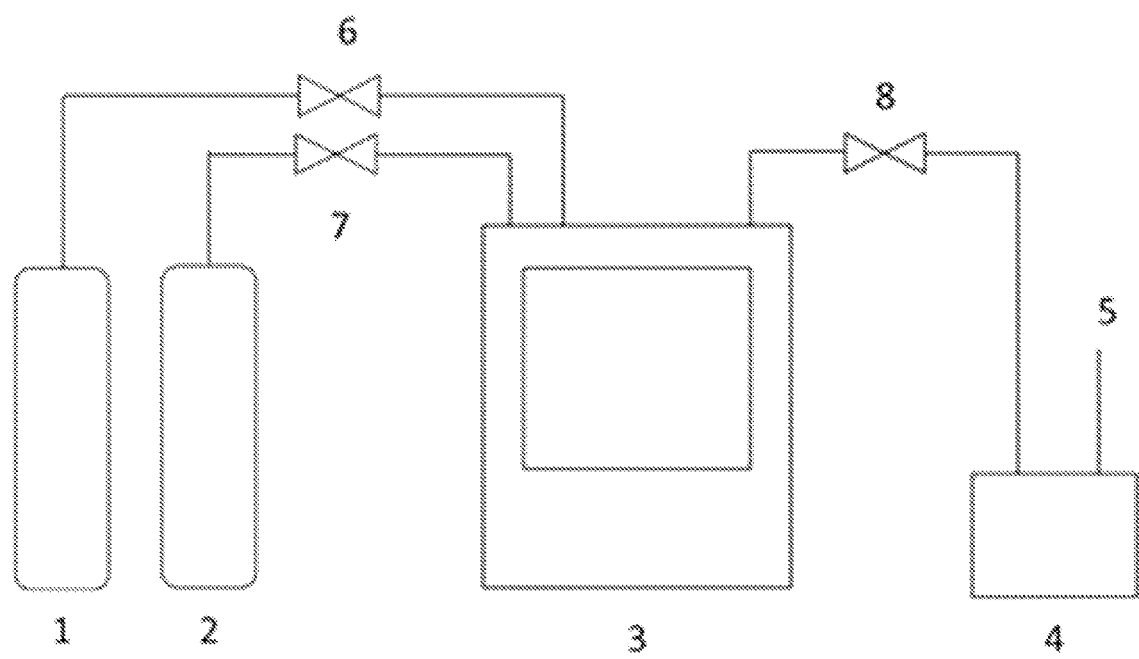
FIG. 5 is a schematic representation of an apparatus for conducting the surface treatment, in accordance with certain embodiments.

This example involves treating one or more batteries (of any type) with $BF_3$ gas. Li-ion batteries may be treated in the apparatus shown in FIG. 5. The dry cell, in a form ready for filling, is put into vacuum oven 3. All the valves are initially closed. Valve 8 is then opened, which applies a vacuum on the oven. Valve 8 is then closed. Next, valve 6 is opened for a period of time to partially fill the oven with $BF_3$ gas from container 1. The $BF_3$ gas reacts with traces of water in the battery according to the following reaction:

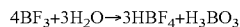
$$4BF_3 + 3H_2O \rightarrow 3HBF_4 + H_3BO_3$$

Valve 1 is then closed. Valve 7 is then opened to release the vacuum inside the oven with inert gas (argon) from container 2. Valve 7 is then closed. Next, valve 8 is opened to evacuate the oven again. Valve 7 is then opened to refill the oven with argon, and then closed. The cells can be now taken from the oven.

EXAMPLE 3

This example is analogous to Example 2. However, in this example, container 1 contains liquid silicon tetrachloride. When Valve 6 is opened, the silicon tetrachloride evaporates and the vapor partially fills oven 3.

The following reaction takes place, with $H_2O$ present in the form of moisture in the battery:

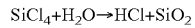
$$SiCl_4 + H_2O \rightarrow HCl + SiO_2$$

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of chemically modifying a surface of an electrochemically active component of a lithium ion battery, the method comprising:
   (a) receiving the electrochemically active material for the lithium ion battery;
   (b) fabricating a stack or a jelly roll containing the electrochemically active material after electrode drying; and
   (c) following fabricating the stack or the jelly roll, exposing the electrochemically active material to a gaseous reactant under conditions that chemically modify surfaces of the electrochemically active material that are accessible to the gaseous reactant, and thereby produce a modified electrochemically active material having improved properties for use in the lithium battery, wherein the surface is modified to a depth of less than 5 nm.

2. The method of claim 1, wherein the gaseous reactant has a molecular weight of about 300 g/mol or less.

3. The method of claim 1, wherein the gaseous reactant is selected from the group consisting of hydrides, oxides, sulfides, oxysulfides, fluorides, and oxyfluorides of carbon, sulfur, phosphorus and boron.

4. The method of claim 1, wherein the gaseous reactant is provided in a carrier gas chosen to affect the reactivity of the gaseous reactant with the electrochemically active material.

5. The method of claim 1, wherein the gaseous reactant is selected from the group consisting of carbon dioxide ($CO_2$), carbon monoxide (CO), boron trifluoride ($BF_3$), carbon tetrafluoride ($CF_4$), carbonyl fluoride ($COF_2$), carbonyl sulfide (COS), fluoroform, forane, methyl fluoride, hexafluoropropylene, hydrogen sulfide, nitrogen trifluoride, phosphorus pentafluoride, perfluoropropane, sulfur dioxide, sulfur hexafluoride, sulfur tetrafluoride, and combinations thereof.

6. The method of claim 1, wherein the gaseous reactant comprises a mixture of two or more of gaseous compounds.

7. The method of claim 6, wherein one of the compounds is selected from the group consisting of nitrogen, helium, and argon.

8. The method of claim 1, wherein the electrochemically active material is an anode active material, wherein the anode active material is a material that intercalates or inserts an alkali metal ion.

9. The method of claim 8, wherein the anode active material is lithium titanium oxide.

10. The method of claim 8, wherein the anode active material is silicon or silicon alloy.

11. The method of claim 1, wherein the electrochemically active material is a cathode active material wherein the cathode active material is $LiMO_2$, $LiMPO_4$, $LiM_2O_4$, a lithium metal silicide, $MS_x$ (metal sulfide), or $M_xO_y$ (metal oxide), where M is metal such as V, Mn, Fe, Co, Ni, Al, Si, or a combination thereof.

12. The method of claim 11, wherein the cathode active material is a lithium metal oxide, lithium mixed metal oxide, lithium metal phosphate, or lithium mixed metal phosphate selected from the group consisting of $LiCoO_2$, $LiMnO_2$, $LiNiO_2$, $LiNi_xCo_{1-x}O_2$, $LiNi_xCo_yMn_{(1-x-y)}O_2$, $LiNi_xCo_yAl_{(1-x-y)}O_2$ whereas $0<x<1$, $0<y<1$, $LiFePO_4$, $LiMnPO_4$, $LiCoPO_4$, $LiFe_xMn_{1-x}PO_4$, $LiNi_xMn_{1-x}O_4$.

13. The method of claim 1, further comprising drying the electrochemically active material prior to exposing the electrochemically active material to the gaseous reactant.

14. The method of claim 1, further comprising contacting the stack or jellyroll with electrolyte after exposing the electrochemically active material to the gaseous reactant.

15. A method of chemically modifying a surface of an electrochemically active component of a lithium ion battery, the electrochemically active material being an anode active material and/or a cathode active material, the method comprising:
(a) receiving the electrochemically active material for the lithium ion battery;
(b) fabricating a stack or a jelly roll containing the electrochemically active material after electrode drying; and
(c) exposing the electrochemically active material to a gaseous reactant that removes surface carbonates and/or deactivates surface hydroxyl groups on the surface of the electrochemically active material.

16. The method of claim 15, wherein receiving the electrochemically active material for the lithium ion battery further comprises receiving an active powder, an active powder mixed with conductive additives, or a coated electrode wherein the coated electrode is compressed or uncompressed.

17. The method of claim 15, further comprising exposing the electrochemically active material to the gaseous reactant under conditions that chemically modify surfaces of the electrochemically active material that are accessible to the gaseous reactant, and thereby produce a modified electrochemically active surface wherein the surface is modified to a depth less than 5 nm.

18. The method of claim 15, further comprising prior to exposing the electrochemically active material, fabricating a stack or a jelly roll containing the electrochemically active material.

19. A method of chemically modifying a surface of an electrochemically active component of a lithium ion battery, the method comprising:
(a) receiving the electrochemically active material for the lithium ion battery and fabricating a stack or a jelly roll containing the electrochemically active material; and
(b) exposing the electrochemically active material, after fabricating the stack or the jelly roll, to a gaseous oxidizing agent under conditions that chemically modify soluble metal ions present on surfaces of the electrochemically active material that are accessible to the gaseous oxidizing agent; and
(c) forming an insoluble metal salt of the metal ions on the surface of the electrochemically active material.

20. The method of claim 19, wherein the gaseous oxidizing agent is fluorine and an insoluble metal fluoride is formed.

21. The method of claim 19, wherein the soluble metal ion is one of $Mn^{2+}$, $Mn^{3+}$, $Co^{2+}$, and $Ni^{2+}$.

22. An electrochemical cell comprising:
a jelly roll or a stack comprising an anode, a cathode, and a separator;
wherein the jelly roll or the stack is exposed to a gaseous reactant that results in electrochemically active material surfaces to be free of hydroxyl groups; and
an electrolyte in contact with the electrochemically active material surfaces.

23. The electrochemical cell of claim 22, wherein the electrochemically active material surfaces are covered by insoluble metal salts.

* * * * *